United States Patent [19]
Jones

[11] 4,383,229
[45] May 10, 1983

[54] RESONANT FILTER CLIPPER CIRCUIT

[75] Inventor: Ronald R. Jones, Phoenix, Ariz.

[73] Assignee: Circuit Research Labs, Tempe, Ariz.

[21] Appl. No.: 284,938

[22] Filed: Jul. 20, 1981

[51] Int. Cl.³ .......................... H03K 5/08; H03H 7/01
[52] U.S. Cl. .................................. 333/176; 307/543; 328/170; 333/17 L
[58] Field of Search .................. 333/17 R, 17 L, 167, 333/175, 176; 307/540–543; 328/168–171, 172–173, 175

[56] References Cited
U.S. PATENT DOCUMENTS 3,098,937  7/1963  Martens .......................... 328/170 X
3,242,437  3/1966  Shiki .............................. 328/170 X

*Primary Examiner*—Marvin L. Nussbaum
*Attorney, Agent, or Firm*—Harry M. Weiss

[57] ABSTRACT

A circuit for peak limiting an audio signal comprises a first "M" derived filter, a first clipping circuit, a second-order low pass filter, a second clipping circuit and a second "M" derived filter. Each "M" derived filter includes a series resonant shunt leg for eliminating clipping harmonics within selected frequency ranges depending upon the resonant frequency of each shunt leg.

12 Claims, 2 Drawing Figures

RESONANT FILTER CLIPPER CIRCUIT

BACKGROUND OF THE INVENTION

1. Field of the Invention

This invention relates generally to clipper circuits and, more particularly, to a resonant filtered clipper circuit which utilizes resonant short circuiting at a clipping point to eliminate specific harmonics.

2. Description of the Prior Art

In the prior art, the most widely used approach to limiting an audio signal has been by means of peak clipping. This technique, however, suffers from the disadvantage that harmonics above 15 KHz are produced. This can result in audible distortion after transmission. In addition, the harmonics may interfere with the synchronizing pilot signal (19 KHz) resulting in loss of stereophonic reception. To help overcome the problems associated with the generation of harmonics, a sharp low-pass filter is employed to assure that the audio signal applied to the stereo generator has little or no high frequency components; i.e. above 15 KHz. Unfortunately, such filters exhibit phase shift and cut-off characteristics which creates ringing at the output.

The above problems have been solved through the use of clipper circuits which generate little or no harmonic components at 19 KHz and 23 KHz to 53 KHz. Special and elaborate filters have been developed using active filter designs, clipping the ringing and refiltering. While generally successful, such circuits are extremely complex and, therefore, costly.

SUMMARY OF THE INVENTION

It is an object of the present invention to provide an improved clipper circuit for limiting an audio signal.

It is a further object of the present invention to provide a clipper circuit for limiting an audio signal which is simple and inexpensive.

It is a still further object of the present invention to provide a clipper circuit for limiting an audio signal which utilizes resonant short circuiting at a clipping point to remove specific harmonics.

It is yet another object of the present invention to provide a non-overshoot clipping filter.

According to a broad aspect of the present invention, there is provided a circuit for peak limiting an input signal having an input and an output, comprising: a first clipping circuit for clipping said input signal at a predetermined voltage; first filter means coupled to said input and to said clipping circuit for eliminating clipping harmonics within a first range of frequencies, said first filter means including a first series resonant circuit which is resonant at a frequency approximately intermediate said first range; second filter means having an input coupled to the output of said first filter means for attenuating frequencies above a predetermined frequency; a second clipping circuit coupled to the output of said circuit; and third filter means coupled to the output of said second filter means, to said second clipping circuit and to the output of said circuit for eliminating clipping harmonics within a second range of frequencies, said third filter means including a second series resonant circuit which is resonant at a frequency intermediate said second range.

The above and other objects, features and advantages of the present invention will be better understood from the following detailed description taken in conjunction with the accompanying drawings, in which:

THE SPECIFICATION

Figure 1:
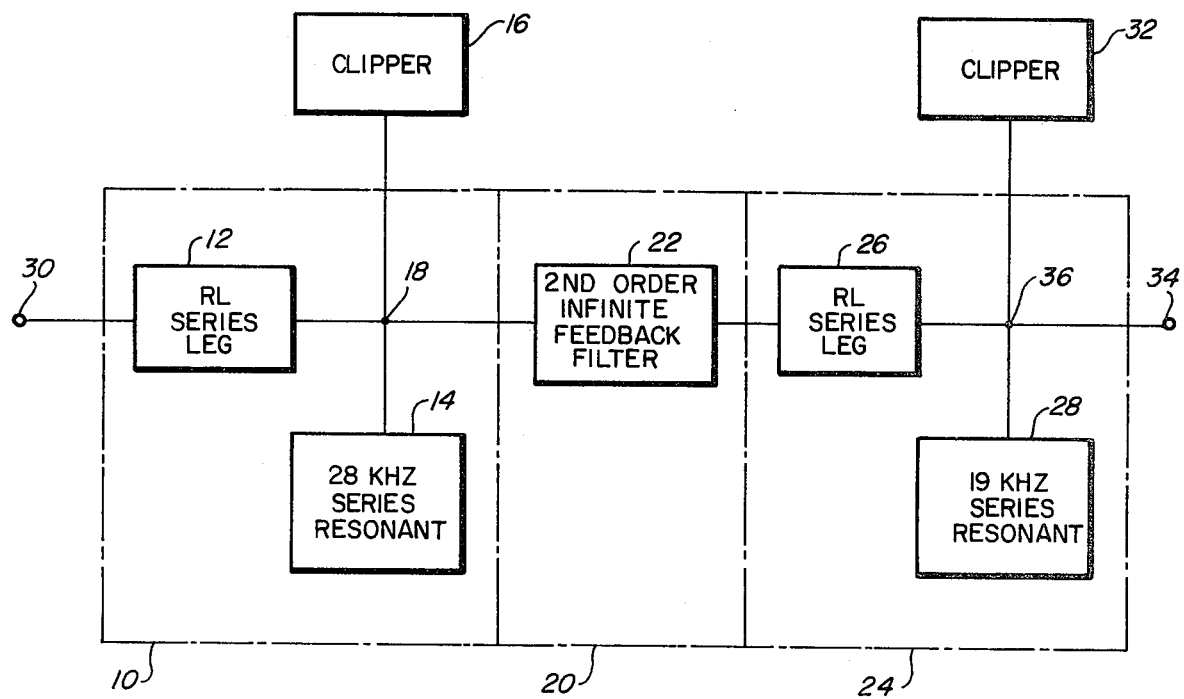
FIG. 1 is a block diagram of the inventive clipping filter.

The filter clipper shown in the block diagram of FIG. 1 is based upon the fact that the impedance of a series resonant circuit is zero.

A modified "M" derived filter 10 includes an RL series leg 12 having an input 30 and a 28 KHz series resonant circuit 14. A clipper 16 is coupled to the junction 18 of the RL series leg 12 and series resonant circuit 14. When clipping occurs, the harmonic components generated of approximately 28 KHz are simply shorted to ground and thereby eliminated from the clipped waveform.

The signal is then forwarded to a second filter 20, preferably a two-pole infinite feedback Butterworth filter 22 which starts to gently roll off in frequency response at about 10 KHz and then breaks sharply at 16 KHz. Filter 20 produces very little ringing or overshoot. The output of filter 20 is applied to a second "M" derived filter 24 which includes an RL series leg 26 and a 19 KHz series resonant circuit 28. A clipper 32 is coupled to the junction 36 of RL series leg 26 and series resonant circuit 28. Clipper 32 clips at the same level as does clipper 16. The output appears at terminal 34.

Figure 2:
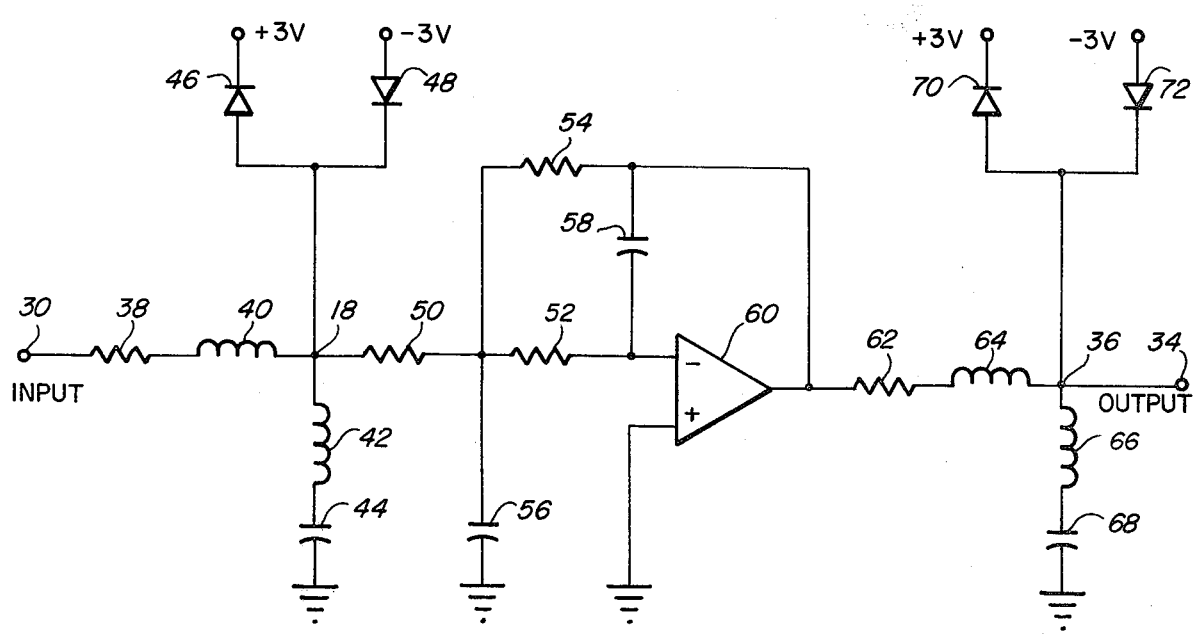
FIG. 2 is a schematic diagram of the inventive clipping filter.

FIG. 2 is a schematic diagram of the resonant filter clipper shown in FIG. 1. The audio signal to be peak limited is introduced at input terminal 30. The RL series leg 12 (FIG. 1) comprises the series combination of resistor 38 and inductor 40 coupled between input terminal 30 and junction 18. The series combination of inductor 42 and capacitor 44 coupled between junction 18 and ground forms a series resonant filter to ground which is resonant at 28 KHz. Diodes 46 and 48 form a full wave threshold clipper which turns on (clips) at approximately 3.6 volts. As can be seen, diode 46 has an anode coupled to junction 18 and a cathode adapted to be coupled to a first source of supply voltage (e.g. +3 volts). Diode 48 has a cathode coupled to junction 18 and an anode adapted to be coupled to a second source of supply voltage (e.g. −3 volts).

The clipped signal at node 18 is applied to second order low pass filter 22 (FIG. 1) which comprises resistors 50, 52 and 54, capacitors 56 and 58 and operational amplifier 60. The non-inverting input of amplifier 60 is coupled to ground while its inverting input is coupled to first terminals of resistor 52 and capacitor 58. The output of amplifier 60 is fed back to resistor 54 and a second terminal of capacitor 58. This filter attenuates frequencies above 16 KHz and is characterized by an initial gentle break point in frequency response to minimize ringing and overshoot.

The series combination of resistor 62 and inductor 64 form series leg 26 (FIG. 1) while inductor 66 and capacitor 68 form series resonant filter 28 (FIG. 1) which is resonant at 19 KHz. This circuit prevents clipping harmonic components of approximately 18 KHz to 20 KHz from appearing at output terminal 34. Diodes 70 and 72 make up the final clipping stage. Diode 70 has an anode coupled to junction 36 and a cathode coupled to the first source of supply voltage. Diode 72 has a cathode coupled to junction 36 and an anode coupled to the second source of supply voltage.

Using the arrangement shown in FIGS. 1 and 2 has yielded a greater than 35 db attenuation of signals from 26 KHz to 30 KHz by filter 10 alone. The attenuation of signals between 18 KHz and 20 KHz has been measured to be in excess of 30 db by filter 24 alone. The dyanamic output attenuation of frequencies between 18 KHz and 20 KHz and between 23 KHz and 53 KHz has been measured to be greater than 55 db and 45 db, respectively. This is greater than the static measurement of the filter and actually represents the sum of the normal harmonic attenuation and the static level of the filter. Thus, the resonant clipper filter described above is not only very simple, but extremely effective.

The above description is given by way of example only. Changes in form and details may be made by one skilled in the art without departing from the scope of the invention as defined by the appended claims.

What is claimed is:

1. A circuit for peak limiting an input signal having an input and an output, comprising:
    a first clipping circuit for clipping said input signal at a predetermined voltage;
    first filter means coupled to said input and to said clipping circuit for eliminating clipping harmonics within a first range of frequencies, said first filter means including a first series resonant circuit which is resonant at a frequency approximately intermediate said first range;
    second filter means having an input coupled to the output of said first filter means for attenuating frequencies above a predetermined frequency;
    a second clipping circuit coupled to the output of said circuit; and
    third filter means coupled to the output of said second filter means, to said second clipping circuit and to the output of said circuit for eliminating clipping harmonics within a second range of frequencies, said third filter means including a second series resonant circuit which is resonant at a frequency intermediate said second range.

2. A circuit according to claim 1 wherein said first filter means is a first "M" derived filter.

3. A circuit according to claim 2 wherein said second filter means is a second-order low-pass filter.

4. A circuit according to claim 3 wherein said third filter means is a second "M" derived filter.

5. A circuit according to claim 1 wherein said first series resonant circuit comprises an inductor and a capacitor adapted to be coupled between the output of said first filter means and a reference potential.

6. A circuit according to claim 5 wherein said first filter means includes a first series leg coupled between the input of the circuit and the junction of said first clipping circuit and said first series resonant circuit, said first series leg comprising the series combination of a resistor and an inductor.

7. A circuit according to claim 6 wherein said second filter means is a second order low pass filter including an operational amplifier.

8. A circuit according to claim 7 wherein said second filter means includes a second series leg coupled to the output of said second order low pass filter, to the junction of said second series resonant circuit and said second clipping circuit and to the output of said peak limiting circuit, said second series leg comprising the series combination of a resistor and an inductor.

9. A circuit according to claim 8 wherein said second series resonant circuit comprises an inductor and a capacitor adapted to be coupled in series between said series leg, said second clipping circuit and said reference potential.

10. A circuit according to claim 9 wherein each of said first and second clipping circuits comprise first and second diodes, the anode of said first diode being coupled to the cathode of said second diode, the cathode of said first diode adapted to be coupled to a first source of supply voltage and the anode of said second diode adapted to be coupled to a second source of supply voltage.

11. A circuit according to claim 10 wherein said first series resonant circuit is resonant at 28 KHz.

12. A circuit according to claim 11 wherein said second series resonant circuit is resonant at 19 KHz.

* * * * *